United States Patent [19]
Gulczynski

[11] Patent Number: 5,214,430
[45] Date of Patent: * May 25, 1993

[54] LADDERLESS TRUE FLASH ANALOG-TO-DIGITAL CONVERTER WITH AUTOMATIC CALIBRATION

[76] Inventor: Zdzislaw Gulczynski, P.O. Box 441, Winchester, Mass. 01890

[*] Notice: The portion of the term of this patent subsequent to Aug. 18, 2008 has been disclaimed.

[21] Appl. No.: 304,505

[22] Filed: Jan. 31, 1989

[51] Int. Cl.$^5$ ............................................. H03M 1/10
[52] U.S. Cl. .................................... 341/120; 341/159; 341/118
[58] Field of Search ............... 341/118, 119, 120, 126, 341/133, 136, 158, 159, 161, 162, 163, 169

[56] References Cited

U.S. PATENT DOCUMENTS

| | | | |
|---|---|---|---|
| 3,961,325 | 6/1976 | Kendall et al. | 341/120 |
| 4,345,241 | 8/1982 | Takeuchi et al. | 341/118 |
| 4,547,763 | 10/1985 | Flamm | 341/118 |
| 4,639,715 | 1/1987 | Doluca | 341/120 |
| 4,794,374 | 12/1988 | Koike | 341/120 |

Primary Examiner—William M. Shoop, Jr.
Assistant Examiner—Howard L. Williams

[57] ABSTRACT

The true flash analog-to-digital converter has an extremely high speed and resolution. The complexity of the comparators is reduced to an absolute minimum, i.e. one or two transistors, preferably FETs. A reference ladder, e.g. resistor network, is completely eliminated. No matching is necessary. 8-bit converter breaking 1 GHz barrier is possible.

The input signal or a reference signal is selectively applied to comparators and compared against base signals stored in capacitors. An encoder is coupled to the comparators for producing the output code. A reference circuit provides the reference signal and a reference code corresponding thereto. A digital comparator compares the code produced by the encoder against the reference code and provides a corrective signal. A demultiplexer applies the corrective signal to one of the capacitors in response to the reference code.

14 Claims, 3 Drawing Sheets

LADDERLESS TRUE FLASH ANALOG-TO-DIGITAL CONVERTER WITH AUTOMATIC CALIBRATION

CROSS REFERENCE TO RELATED INVENTIONS

This invention is related to the following inventions by the same inventor:

"Ultra Fast Logic with Temperature Compensation and Minimized Supply Voltage" Ser. No. 474,489 filed Feb. 2, 1990;

"Dual Flash Analog-to-Digital Converter" Ser. No. 316,592 filed Feb. 24, 1989;

"Dual Flash Analog-to-Digital Converter" Ser. No. 316,593 filed Feb. 24, 1989;

"Dual Flash Analog-to-Digital Converter" Ser. No. 316,594 filed Feb. 24, 1989;

"Segmented Encoder and Digital Memory Particularly for Flash Analog-to-Digital Converters" Ser. No. 304,506 filed herewith;

"Ultra Fast Digital-to-Analog Converter with Independent Bit Current Source Calibration" filed herewith, now U.S. Pat. No. 4,958,155 dated Aug. 18, 1990;

"High Power Switching Power Supply with High Power Factor" Ser. No. 304,508 filed herewith;

"High Power Switching Power Supply Having High Power Factor" filed herewith, now U.S. Pat. No. 4,956,760 dated Sep. 11, 1990;

"High Accuracy Reference Ladder" filed herewith, now U.S. Pat. No. 4,929,848 dated May 29, 1990;

"High Speed Integrating Analog-to-Digital Converter" filed herewith, now U.S. Pat. No. 4,940,982 dated Jul. 10, 1990;

"Flash Analog-to-Digital Converter with Integrating Input Stage" Ser. No. 248,495 filed Sep. 22, 1988;

"Encoder with Error Correction Particularly for Flash Analog-to-Digital Converters" Ser. No. 225,240 filed Jul. 28, 1988;

"Sample-and-Hold Amplifier with Controllable Source Charger" U.S. Pat. No. 4,980,686 dated Dec. 25, 1990;

"High Speed Integrating Digital-to-Analog Converter" Ser. No. 441,391 filed May 23, 1988;

"Ultra Fast Logic" U.S. Pat. No. 4,943,740 dated Jul. 24, 1990;

"High Speed Instrumentation Amplifier with Minimized Offset Voltage and Drift" U.S. Pat. No. 4,829,263 dated May 5, 1989;

"Digital-to-Analog Converter with Digital Correction" U.S. Pat. No. 4,843,392 dated Jun. 27, 1989;

"Flash Analog-to-Digital Converter" U.S. Pat. No. 4,763,106 dated Aug. 9, 1988;

"Dual Flash Analog-to-Digital Converter" U.S. Pat. No. 4,857,931 dated Aug. 15, 1989;

"Digital-to-Analog Converter" U.S. Pat. No. 4,811,017 dated Mar. 7, 1989;

"Digital-to-Analog Converter" U.S. Pat. No. 4,837,572 dated Jun. 6, 1989; and

"Operational Amplifier or Comparator Circuit with Minimized Offset Voltage and Drift" U.S. Pat. No. 4,749,953 dated Jun. 7, 1988.

BACKGROUND OF THE INVENTION

The invention relates to a true flash analog-to-digital converter (ADC) for digital systems requiring fastest possible high resolution conversion of an analog input signal into a corresponding digital output code.

The conventional true N-bit flash ADCs comprise a reference source, K comparators connected in parallel and a chain of K (mostly K+1) equally valued resistors providing reference voltages thereto, wherein $K=2^N-1$. An encoder samples the comparator output signals, corrects faulty codes and provides binary output code. All ADCs are clocked.

The true flash ADCs offer the fastest possible conversion as the input signal is converted into the output code in just one cycle. In particular, no feedback manipulating the input signal is used as the quantization level thereof is determined in a straightforward structure. Moreover, the conversion of the input signal into the digital form is performed in a most simple manner and by just one type of component, i.e. comparator. Digital pipelining is often used to boost sampling rates.

The conventional flash ADCs do suffer however from many problems, mostly originating from inaccuracy or complexity of the comparators. In particular, the employment of the required number of comparators having a poor accuracy results in missing codes. Generally, comparators with bipolar input stage have smaller input error voltages. However, the input bias currents are very high and vary with the input signal. The bias currents are added so that different resistors of the resistor network conduct different currents. Thereby, the reference signals provided by the network are unstable and resistor values must be small. Moreover, the respective bipolar transistors require high collector currents as to achieve short transition times. As a result, the ADCs consume a large amount of power and a relatively low resolution is achievable.

FETs are generally faster than bipolar transistors and have input currents practically equal zero. However, FET input comparators have a very poor accuracy. Autozeroing comparators are necessary which however significantly increase the circuit complexity and reduce the conversion speed. As a result, the flash ADCs based on FET comparators have a higher resolution and improved power consumption. The conversion speed which is the main objective of flash ADCs is diminished. The resistor network is still necessary.

The resistor network is unavoidable in conventional flash ADCs and causes deficient long term and temperature stability, reduced speed and accuracy, enlarged chip space and increased power consumption, etc. In contrast, integrated MOS capacitors are most accurate integrated circuit components. For instance, their absolute accuracy and tolerance fluctuation due to time, mechanical stress and voltage are far superior to any other component.

The poor accuracy and complexity of the comparators as well as the performance of the resistor network result in missing codes. Certain kinds of errors caused by a false response of the comparators are not possible to correct thru a digital correction in the encoder, wherein a final error is large. For instance, the flash ADCs have a tendency to miss a code every few billion conversions, i.e. several times a minute when ADC is sampling at 100 MHz.

SUMMARY OF THE INVENTION

The invention is intended to provide a true flash ADC having an extremely high speed and resolution. The complexity of the comparators is reduced to an absolute minimum, i.e. one or two transistors preferably FETs. A reference ladder, e.g. resistor network, is completely eliminated. No matching is necessary. The present invention makes possible 8-bit ADC breaking the 1 GHz barrier.

ADC according to the invention converts input signal into output code and comprises a first and second nodes with one node coupled to ground, a plurality of analog comparator means each comparing a signal at the first node against a respective base signal, a plurality of capacitor means coupled to the second node for storing the base signals, a reference means for providing a reference signal and reference code corresponding thereto, a switch means for selectively coupling the other node to the input signal or reference signal, an encoder means coupled to the analog comparator means for producing the output code, a digital comparator means for comparing either a code applied to or produced by the encoder means against the reference code and providing a corrective signal, and a demultiplexer means for applying the corrective signal to one of the capacitive means in response to the reference code.

In another embodiment the encoder has a first output, and the ADC further includes an analog-to-digital converter means having a second output, for converting the input signal into a second output code, a first multiplexer means for selecting the first or second output and providing the output code, a second switch means for selectively applying the reference signal or input signal to the analog-to-digital converter means, and a second multiplexer means for selectively coupling the first or second output to the digital comparator means.

In yet another embodiment at least one analog comparator means includes a transistor having a source and gate coupled to the first node and base signal respectively.

The present flash ADC comprises a plurality of analog comparators and a digital comparator which compare analog signals and digital codes respectively. Therefore, merely the term comparator will be used since the comparator type can be easy distinguished. Offset voltage of a comparator or amplifier depends on temperature, input voltage level, etc. Therefore, an error voltage is a momentary value of the offset voltage.

BRIEF DESCRIPTION OF THE DRAWINGS

The present invention will become more clear in conjunction with the accompanying figures throughout which similar references may denote similar parts and of which.

DETAILED DESCRIPTION OF THE INVENTION

Figure 1:
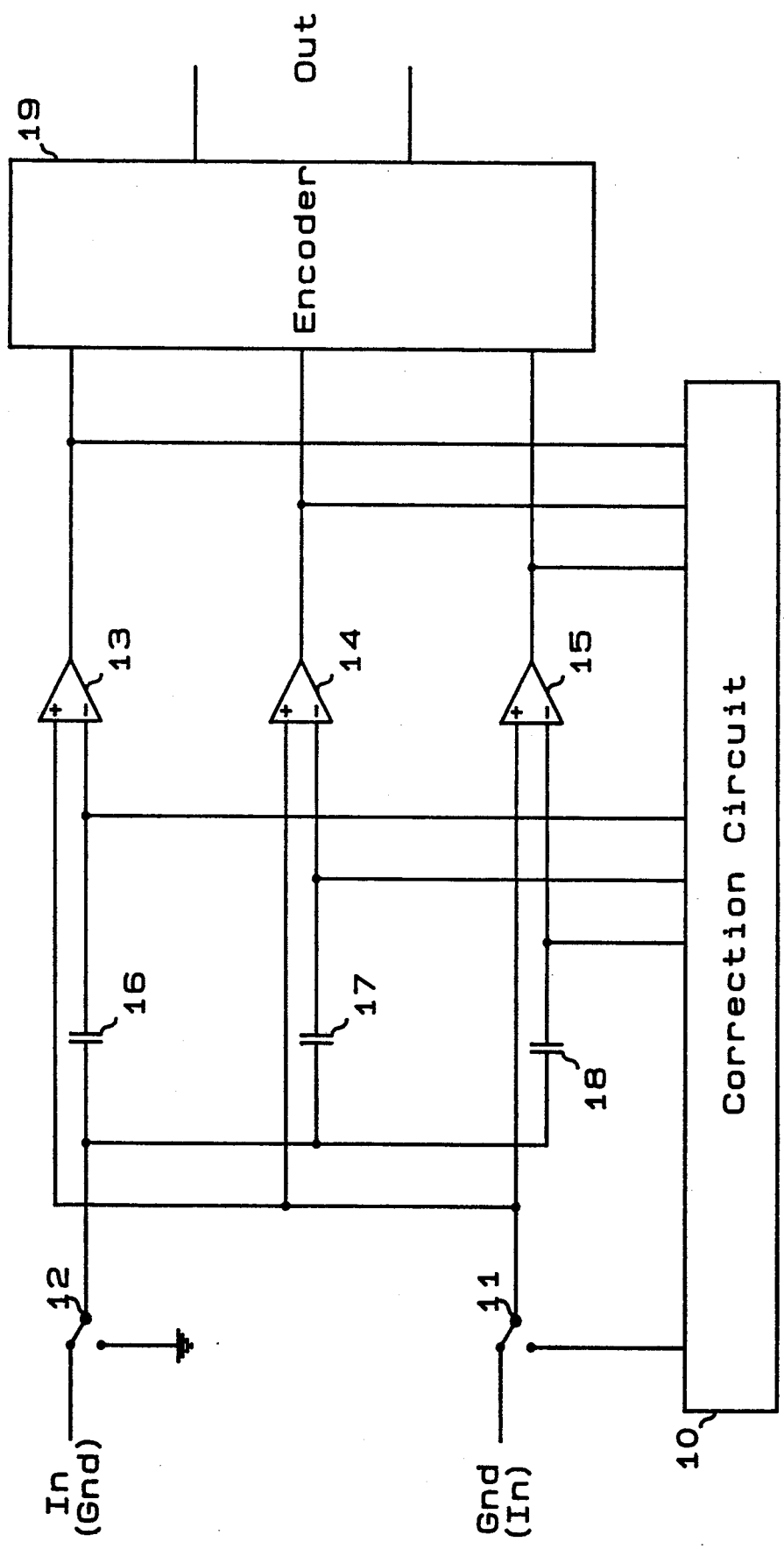
FIG. 1 is an embodiment of 2-bit flash ADC.

FIG. 1 is an embodiment of 2-bit flash ADC. The comparators 13 thru 15 each have a noninverting and inverting inputs for comparing signals applied thereacross. The noninverting inputs are coupled to a first node. The capacitors 16 thru 18 are coupled between a second node and the inverting inputs of the comparators 13 thru 15 respectively for storing base signals. The encoder 19 is employed for sampling outputs of the comparators 13 thru 15, correcting possible faulty codes and producing ADC output code. An encoder for ordinary flash ADCs can be employed. The encoders disclosed in the abovementioned "Encoder for Flash Analog-to-Digital Converters" Ser. No. 225,240 filed Jul. 28, 1988 and "Encoder and Digital Memory for Flash Analog-to-Digital Converters" Ser. No. 304,506 herewith, both by the same inventor, are recommended ,for a superior performance.

The first and second nodes are coupled to the switches 11 and 12 respectively. In one embodiment, the switch 11 selectively couples the first node to ground or a reference signal deriving from the correction circuit 10. The switch 12 selectively couples the second node to the ADC input signal or ground. In another embodiment, indicated by names in parenthesis, the first node is selectively coupled to the input or reference signal via the switch 11. The second node is coupled to ground, whereby the switch 12 is superfluous. By these means one of the nodes is coupled to ground and the remaining node is coupled to the ADC input signal or reference signal.

The correction circuit 10 examines the comparators 13 thru 15 one at a time when the switches 11 and 12 are switched. Specifically, the circuit 10 generates the reference signal, monitors output of the respective comparator and applies a corrective signal to the capacitor coupled to that comparator. The output thereof is determined when a momentary value of the reference signal corresponds exactly to the respective quantization level. In particular a comparator compares the code applied to the encoder 19 against the reference code and provides a corrective signal. If the comparator output is high or low, the voltage across the capacitor coupled to that comparator is increased or decreased respectively.

The comparators 13 thru 15 may have large error voltages which are compensated for by base voltages stored in the capacitors 16 thru 18 respectively. Specifically, any base voltage is a sum of the respective error voltage and quantization level. The switching points of the comparators are determined only at their specific quantization levels, whereby the dependence of the respective error voltage on the ADC input signal level is considered. The error voltages of the comparators 13 thru 15 largely depend on temperature whose variations are relatively slow. The base voltages change accordingly and can be corrected sporadically, e.g. several times a second.

Figure 2:
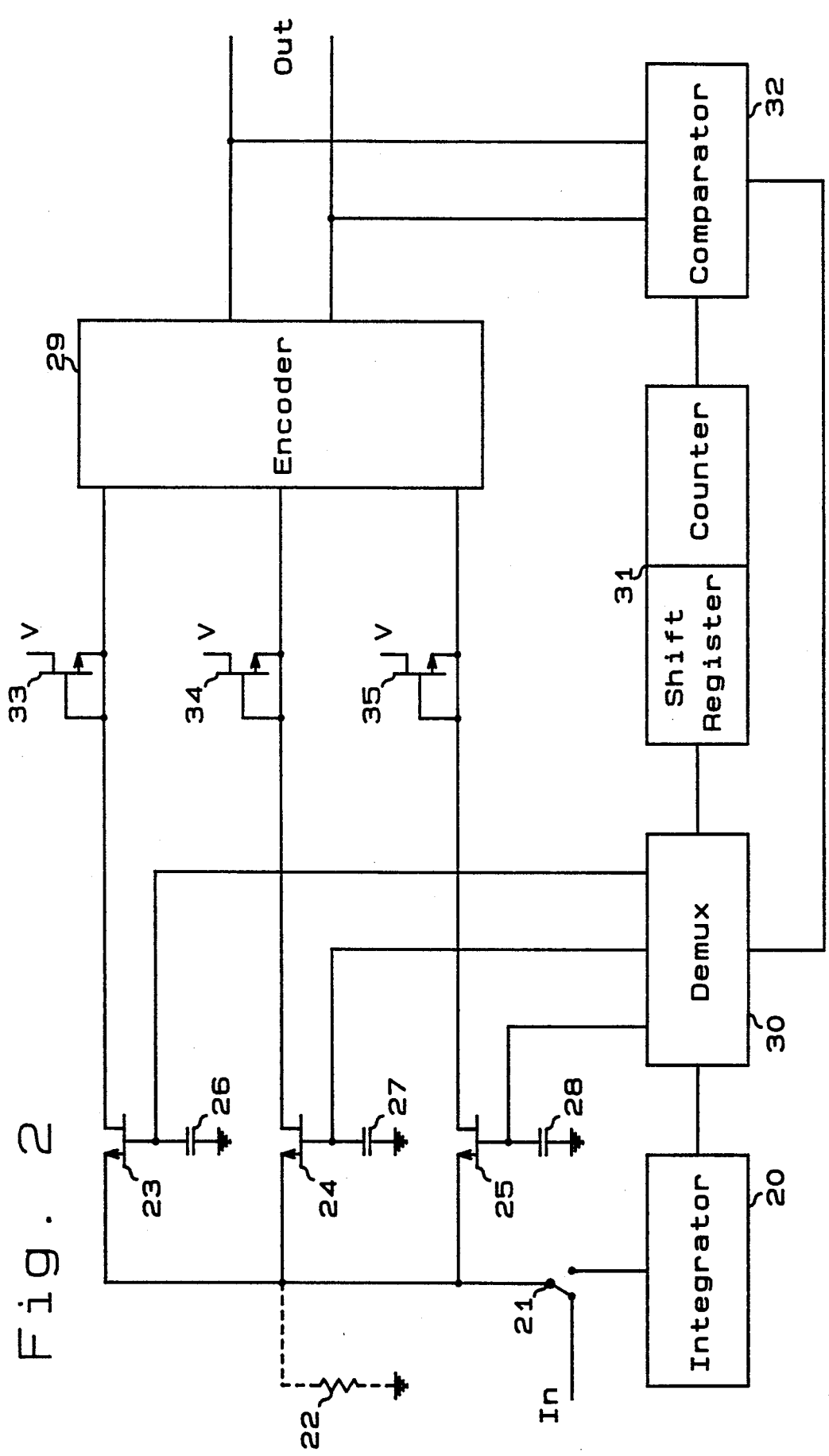
FIG. 2 is the preferred embodiment of 2-bit flash ADC with comparators each consisting of two transistors.

FIG. 2 is the preferred embodiment of 2-bit flash ADC with comparators each consisting of two transistors. N-channel FETs are shown, wherein MOSFETs, MESFETs, JFETs, etc. can be employed. Bipolar transistors are not recommended due to huge base currents thereof. The pairs of transistors 23 and 33, 24 and 34, 25 and 35 constitute comparators corresponding to 13 thru 15 of FIG. 1 respectively. The sources and gates of the transistors provide the noninverting and inverting inputs of the comparators respectively. The sources of the transistors 23 thru 25 are coupled to a first node. The capacitors 26 thru 28 are coupled between a second node and the gates of the transistors 23 thru 25 respectively for storing base signals. The second node is connected to ground.

The transistors 23 thru 25 have drains which are coupled to the encoder 29 and biased by current sources. The transistors 33 thru 35 constitute the current sources and have drains coupled to the supply voltage V. The gates and sources of the transistors 33 thru 35 are tied together and are further coupled to drains of the transistors 23 thru 25 respectively. Resistors can be substituted for the transistors 33 thru 35. However, the employment of the current sources results in a reduced power consumption, optimal drain currents and highest possible voltage gain of the respective comparators. The transistors 33 thru 35 are superfluous if the encoder 29 provides suitable input currents as to bias the transistors 23 thru 25.

The switch 21 selectively couples the first node to the input signal or a reference signal deriving from the integrator 20.

The second node is coupled to ground, whereby the capacitors 26 thru 28 are coupled to ground. The error voltages of the comparators are fairly large and equal to gate-source voltages of the transistors 23 thru 25 determined at the respective quantization levels. The error voltages are compensated for by the voltages stored in the capacitors 26 thru 28 respectively. Specifically, any base voltage stored therein is a sum of the respective gate-source voltage and quantization level.

During the correction of the base voltages, the switch 21 is switched so that the reference signal is applied to the sources of the transistors 23 thru 25. The integrator 20 provides a linear ramp signal as reference signal. Simultaneously, the circuit 31 provides a pair of reference codes representing the ramp signal. Specifically, the circuit 31 includes a clock oscillator, shift register and counter. The counter provides a binary reference code. The comparator 32 compares the binary code produced by the encoder 29 against the binary reference code and provides a corrective signal.

The shift register provides the second reference code. In response thereto the demultiplexer 30 applies the corrective signal to one of the capacitors 26 thru 28, whereby the respective base voltage is corrected. The second reference code contains a single 1, whereby only one switch of the demultiplexer 30 is actuated. The complexity of the demultiplexer 30 is significantly reduced as the switches thereof are directly controlled by the shift register. A decoder is unnecessary.

The operation of the ADC will become more clear by analyzing an example of the 2-bit ADC. For the purpose of clarity, full scale range is 4 V so that 1 V of the ADC input or ramp signal corresponds to 1 least significant bit of the reference code and ADC output code. Consequently, the quantization levels of the comparators including the transistors 23 thru 25 are 3 V, 2 V and 1 V respectively. By way of example, the gate-source voltages of the transistors 23 thru 25 at the respective quantization levels are equal 2.3 V, 2.4 V and 2.5 V respectively. Obviously, the base voltages across the capacitors 26 thru 28 will be adjusted to 5.3 V, 4.4 V and 3.5 V respectively.

The correction of the base voltages takes place when the switch 21 is switched so that the ramp signal is applied to the sources of the transistors 23 thru 25. The integrator 20 provides the ramp signal which is also represented by the binary and second reference codes provided by respectively 2-bit counter and 3-bit shift register of the circuit 31. Initially, the ramp signal is equal 0 V, counter is reset and shift register is set to 100, whereby the demultiplexer 30 selects the capacitor 28. If the code produced by the encoder 29 is 00, the comparator 32 provides a corrective current which increases the base voltage across the capacitors 28. If the encoder code is greater than 00, the polarity of the current is reversed and the capacitor voltage is decreased.

The current is delivered to the capacitor 28 as long as the ramp voltage is smaller than or equal to 1 V. Under normal operating conditions, the capacitor 28 will be charged and discharged so that the base voltage across the capacitors 28 will be substantially equal 3.5 V when the ramp voltage reaches 1 V. The comparator 32 provides the corrective current having a determinable polarity. The rate at which the capacitor 28 is charged depends on the charging current and is slightly higher than the rate of the ramp voltage provided by the integrator 20. The accuracy of the current discharging the capacitor 28 is even less critical.

The pattern is repeated when the ramp signal is greater than 1 V and smaller than or equal to 2 V. The counter is incremented to 01 and shift register shifts 1 right as to output 010, whereby the demultiplexer 30 selects the capacitor 27. If the code produced by the encoder 29 is smaller than or equal to 01, the corrective current increases the base voltage across the capacitors 27. Otherwise, the respective base voltage is decreased. Similarly, if the ramp signal is greater than 2 V and smaller than or equal to 3 V and encoder code is smaller than 10, the base voltage across the capacitors 26 is increased. Otherwise, the respective base voltage is decreased.

The correction of the base voltages is accomplished when the ramp signal of the integrator 20 reaches 3 V. Subsequently, the demultiplexer 30 is disabled which is equivalent to the corrective signal set to zero. Abnormal operating conditions, such as after power-up when the capacitors 26 thru 28 are discharged, can be also detected. For instance, the correction can be restarted whenever the difference between the code produced by the encoder 29 and counter, as detected by the comparator 32, is greater than one. The value of the ramp signal having a known rate can be precisely determined by counting clock pulses. Therefore, the count of the counter is incremented by one when the ramp signal reaches 1 V, 2 V and 3 V. Consequently, the output of the shift register is divided by two.

A controllable reference source may be substituted for the integrator 20 for providing predeterminable reference voltages. For instance, a low speed high accuracy digital-to-analog converter, controlled by the counter of the circuit 31, can be employed. The voltages across the capacitors 26 thru 28 are adjusted in the same manner. For instance, if the digital-to-analog converter provides 1 V, the voltage across the capacitor 28 is adjusted until the output of the encoder oscillates between 00 and 01.

The ADC input current flows to the first node and depends on the ADC input voltage. In particular, if the voltage is 0 V, the current is equal to the sum of the currents provided by the current sources consisting of the transistors 33 thru 35. The input current is near zero for the ADC input voltage substantially greater than 3 V. The optional resistor 22 is coupled between the first node and ground to significantly reduce this effect. Specifically, maximum the current flowing to the first node and consisting of source currents of the transistors 33 thru 35 is balanced by the resistor current having approximately equal maximum value at 3 V and flowing in the opposite direction. As a result, the ADC input current is approximately constant. Moreover, the effect of a parasitic input capacitance at the first node is minimized.

The on-resistance of the switch 21 may become essential at higher resolution of the ADC. However, this effect can be eliminated by coupling an input amplifier, such as 43 of FIG. 3, in series with the first node. The ADC input current can be significantly reduced by exchanging the first node for second node. The capacitors 26 thru 28 are then coupled to the switch 21 rather than ground. Consequently, the transistors 23 thru 25 have sources coupled to ground and operate in common source mode. An ordinary switch 21 can be employed. The disadvantages of this configuration are reduced accuracy and conversion time of the ADC.

The embodiment of FIG. 2 has a shortest possible conversion time as the complexity of the comparators is reduced to an absolute minimum, i.e. one or two transistors. Moreover, the transistors 23 thru 25 operate in common gate mode which assures highest possible voltage gain and speed. All transistors can be of one type, e.g. depletion mode FETS. The transistors 33 thru 35 may be also considered as a part of encoder input gates. The transistors 33 thru 35 are superfluous if the encoder 29 provides suitable input currents as to bias the transistors 23 thru 25. The demultiplexer 30 includes three switches coupled to the output of the comparator 32 and further separately coupled to the capacitors 26 thru 28. The on-resistances of the switches are insignificant. Moreover, the effect of any parasitic capacitances of the demultiplexer 30 is eliminated since the capacitors 26 thru 28 are coupled to ground.

High accuracy integrator 20 and clock oscillator of the circuit 31 are easy achievable. The accuracy of the remaining components is not essential. This includes values of the capacitors 26 thru 28, gate-source voltages of the transistors 23 thru 25 at switching points, currents provided the transistors 33 thru 35, etc. The influence of on-resistance of the switch 21 can be eliminated by employment of an input amplifier such as 43 in FIG. 3. During the correction of the base voltages, the output rather than input of the encoder 29 is determined. By these means, threshold levels of input gates, input bias currents and voltage gains of the encoder 29 at the switching points are also considered.

Figure 3:
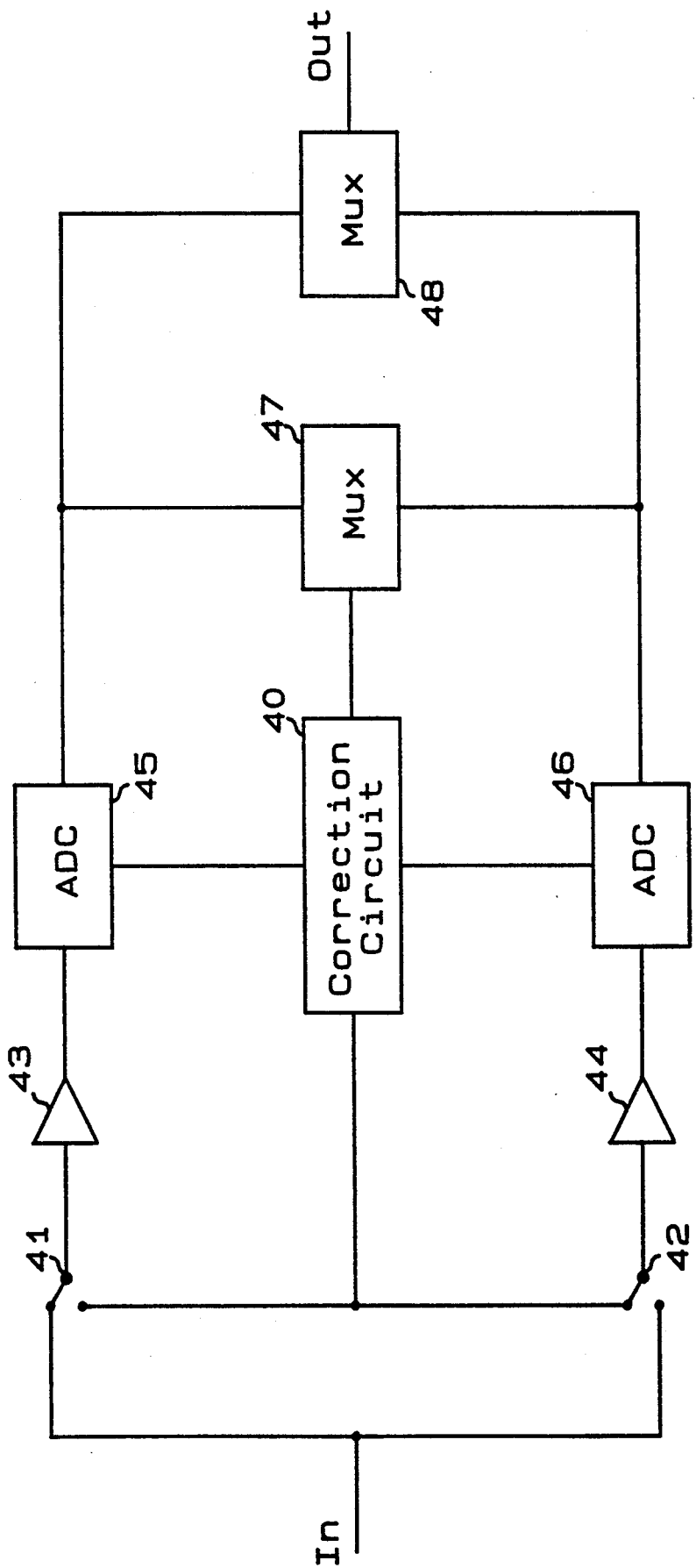
FIG. 3 is a block diagram of flash ADC for uninterrupted conversion of the ADC input signal.

FIG. 3 is a block diagram of flash ADC for uninterrupted conversion of the ADC input signal. The components 42 thru 44 and 47 are optional. In this simplified embodiment, the switch 41 selectively applies the input or reference signal to the ADC 45. The ADC 45 includes an encoder which has a first output. The ADC 46 converts the input signal into a second output code which appears at a second output. The multiplexer 48 selects the first or second output and provides the output code of the entire ADC. Specifically, the multiplexer 48 selects the output code produced by the ADC 45 if the input signal is applied thereto. During the correction of the base voltages, the correction circuit 40 provides the reference signal to the ADC 45 and receives the output code therefrom. The multiplexer 48 selects the output code produced by the ADC 46. The ADC 46 can be of any type. However, a flash ADC results in a highest possible conversion rate.

In another embodiment, the switch 42 selectively applies the reference or input signal to the ADC 46. The multiplexer 47 selectively couples the first output of the ADC 45 or second output of the ADC 46 to a comparator of the correction circuit 40. By way of example, FIG. 3 shows the switch 41 applying the input signal to the ADC 45 while the switch 42 applies the reference signal to the ADC 46. Consequently, the multiplexer 48 selects the output code of the ADC 45. The correction circuit 40 provides the reference signal to the ADC 46 and receives the output code therefrom via the multiplexer 47. By these means, the ADC 45 produces the ADC output code while the base voltages of the ADC 46 are corrected. The ADCs 45 and 46 swap the functions when the switches 41 and 42 are switched.

The correction circuit 40 corresponds to 10 of FIG. 1. ADCs such as shown in FIGS. 1 and 2 can be employed as ADCs 45 and 46. The correction circuit shown in FIG. 2 and comprising the components 20 and 30 thru 32 can be employed as circuit 40. In particular, the integrator 20 provides the reference signal and the code produced by the encoder 29 is applied to the comparator 32. Accordingly, the multiplexer 47 selectively applies the code produced by the encoder of the ADC 45 or a code produced by the ADC 46 to a comparator of the correction circuit 40. The circuit 40 also comprises a pair of demultiplexers having outputs coupled to capacitors of the ADCs 45 and 46 for the correction of respective base voltages.

The amplifiers 43 and 44, e.g. voltage followers, are coupled in series with the ADCs 45 and 46 respectively. The switch 41 and amplifier 43 constitute a switch means. This switch means can be substituted for the switch 11 or 12 of FIG. 1 or 21 of FIG. 2, i.e. operate in series with the respective node. Similarly, the switch 42 and amplifier 44 constitute another switch means. The input impedances of the amplifiers 43 and 44 are high so that on-resistances of the switches 41 and 42 are insignificant. Error voltages of the amplifiers 43 and 44 are inherently compensated for during the correction of the base voltages of the ADCs 45 and 46 respectively. The conversion of the ADC input signal is uninterrupted as the conversion and correction of the base voltages take place simultaneously.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Analog-to-digital converter for converting input signal into output code, comprising:
   a first and second nodes with one node coupled to ground;
   a plurality of analog comparator means each comparing a signal at the first node against a respective base signal;
   a plurality of capacitor means coupled to the second node for storing the base signals;
   a reference means for providing a reference signal and reference code corresponding thereto;
   a switch means for selectively coupling the other node to the input signal or reference signal;
   an encoder means coupled to the analog comparator means for producing the output code;
   a digital comparator means for comparing either a code applied to or produced by the encoder means against the reference code and providing a corrective signal; and
   a demultiplexer means for selecting one of the capacitor means and applying the corrective signal thereto in response to the reference code.

2. Analog-to-digital converter of claim 1 wherein at least one analog comparator means includes a transistor having a source and gate electrodes coupled to the firs node and base signal respectively.

3. Analog-to-digital converter of claim 2 wherein the transistor has a drain electrode, and
  further wherein the one analog comparator means includes a current source means for biasing the drain electrode of the transistor.

4. Analog-to-digital converter of claim 3 wherein the current source means includes a second transistor having a source and gate electrodes coupled to the drain electrode of said first transistor.

5. Analog-to-digital converter of claim 1 wherein the reference means includes an integrator means for providing a ramp signal.

6. Analog-to-digital converter of claim 1 wherein the reference means includes a counter means for providing the reference code.

7. Digital-to-analog converter of claim 1 wherein the reference means includes a shift register means for providing a second reference code, and
  further wherein the demultiplexer means is responsive to the second reference code.

8. Analog-to-digital converter of claim 1 further including a resistive means coupled to the other node for balancing a current flowing thereto.

9. Analog-to-digital converter of claim 1 wherein the switch means includes an amplifier coupled in series with the other node.

10. Analog-to-digital converter of claim 1 further including a second switch means for selectively coupling the one node to ground or reference signal,
  wherein said first switch means selectively couples the other node to the input signal or ground.

11. Analog-to-digital converter of claim 1 wherein the digital comparator means provides a corrective current having a determinable polarity.

12. Analog-to-digital converter of claim 1 wherein the encoder has a first output, and further including:
  a second analog-to-digital converter means having a second output, for converting the input signal into a second output code; and
  a multiplexer means for selecting the first or second output and providing the output code.

13. Analog-to-digital converter of claim 12 further including:
  a second switch means for selectively applying the reference signal or input signal to the second analog-to-digital converter means; and
  a second multiplexer means for selectively coupling the first or second output to the digital comparator means.

14. Analog-to-digital converter of claim 13 wherein the second switch means includes an amplifier coupled in series with the second analog-to-digital converter means.

* * * * *